United States Patent [19]

Naito

[11] Patent Number: 5,153,812
[45] Date of Patent: Oct. 6, 1992

[54] COMPOSITE LC ELEMENT

[75] Inventor: Akira Naito, Sagamihara, Japan

[73] Assignee: Mitsubishi Denki Kabushiki Kaisha, Tokyo, Japan

[21] Appl. No.: 538,427

[22] Filed: Jun. 15, 1990

[30] Foreign Application Priority Data

| Jun. 16, 1989 | [JP] | Japan | 1-154210 |
| Aug. 28, 1989 | [JP] | Japan | 1-220864 |
| Oct. 27, 1989 | [JP] | Japan | 1-280431 |
| Oct. 27, 1989 | [JP] | Japan | 1-280444 |
| Jan. 16, 1990 | [JP] | Japan | 2-6772 |
| Jan. 19, 1990 | [JP] | Japan | 2-9834 |
| Feb. 1, 1990 | [JP] | Japan | 2-22568 |

[51] Int. Cl.⁵ .................. H01F 15/14; H03H 7/00
[52] U.S. Cl. .................. 361/270; 333/181; 333/185; 336/69
[58] Field of Search .......... 336/69, 70, 165, 183, 336/223; 361/268, 270; 333/185, 184, 181, 182; 455/307; 315/244, 276, 291

[56] References Cited

U.S. PATENT DOCUMENTS

| 3,210,703 | 10/1965 | Lockie | 336/69 |
| 3,638,155 | 1/1972 | Combs | 336/69 |
| 4,368,407 | 1/1983 | Wroblewski | 315/291 |
| 4,866,407 | 9/1989 | Ikeda | 333/184 |
| 4,945,322 | 7/1990 | Okumura | 333/184 |

FOREIGN PATENT DOCUMENTS 59-139618 8/1984 Japan .

Primary Examiner—A. D. Pellinen
Assistant Examiner—Richard T. Elms
Attorney, Agent, or Firm—Oblon, Spivak, McClelland, Maier & Neustadt

[57] ABSTRACT

A composite LC element including integrally a coil and a capacitor which comprises a layered film structure wherein insulating films and electrode sheets with terminals at their both ends are alternately laminated, said layered film structure being wound in a spiral form from its one end. An intermediate electrode sheet having a shorter length and having a terminal at its one end may be interposed between said insulating films. Said electrode sheet may have an additional terminal at an intermediate portion.

5 Claims, 10 Drawing Sheets

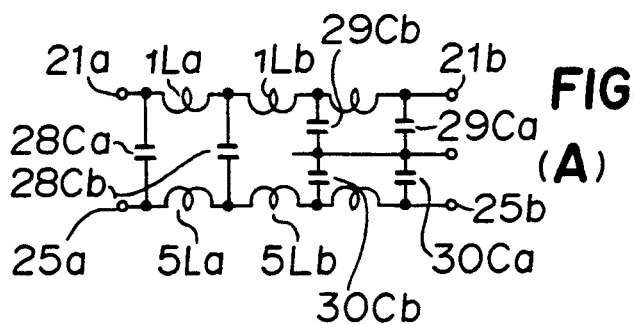
FIGURE 10 (A)
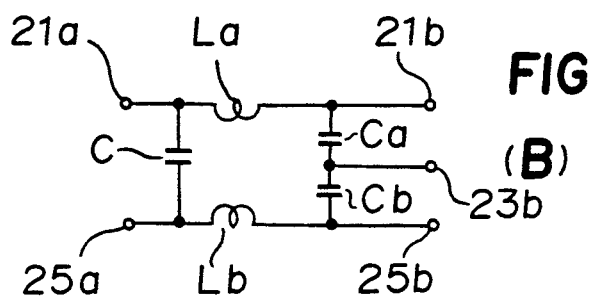
FIGURE 10 (B)
FIGURE 11
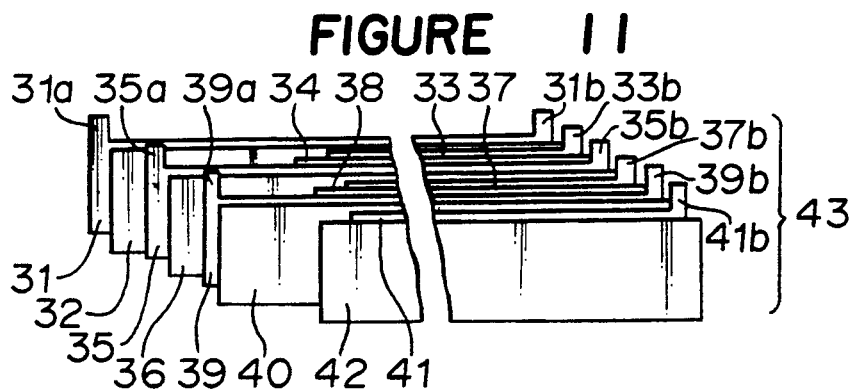
FIGURE 12
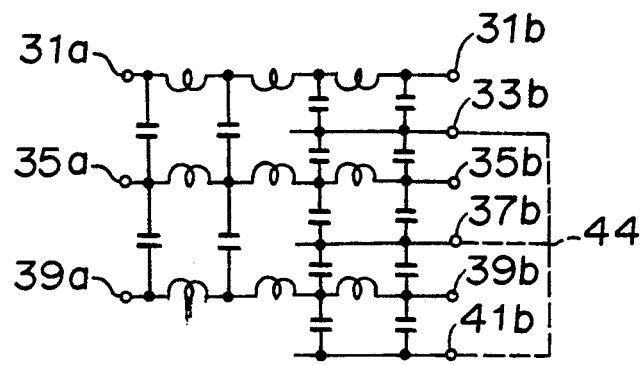

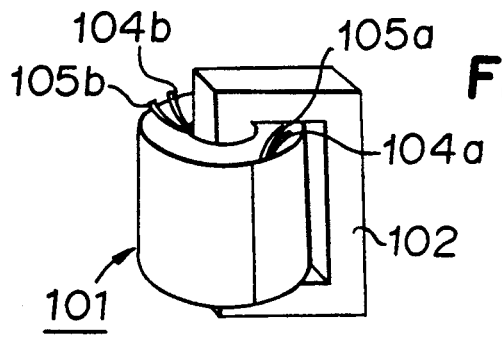
FIGURE 33
FIGURE 34
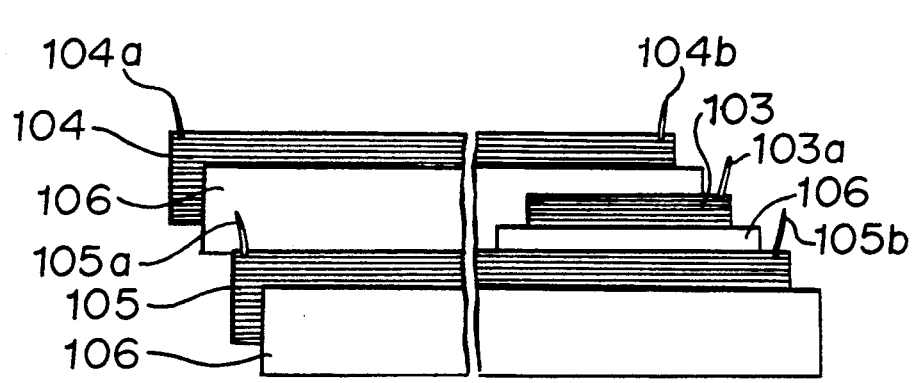
FIGURE 35
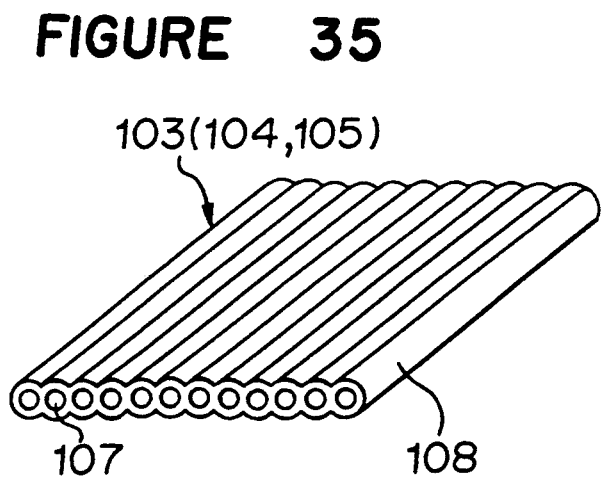

COMPOSITE LC ELEMENT

BACKGROUND OF THE INVENTION

1. Field of the Invention

The present invention relates to a composite LC element.

2. Discussion of Background

FIG. 1 is a diagram showing a layered film structure of a conventional composite LC element disclosed in, for instance, Japanese Unexamined Patent Publication No. 139619/1984, FIG. 2 is a perspective view partly broken of the composite LC element as shown in FIG. 1 wherein the element is wound around a magnetic core, and FIG. 3 is a diagram showing the equivalent circuit of the composite LC element as in FIG. 2. In FIGS. 1 through 3, reference numerals 1 and 2 designate insulating films, numerals 3, 4 and 5 designate electrode sheets, numerals 3a, 3b, 4a and 5b designate terminals provided at the electrode sheets and a numeral 6 designates a magnetic substance. A composite LC element is formed by winding in a spiral form a layered film structure consisting of the insulating films 1, 2 and the electrode sheets 3, 4, 5 as shown in FIG. 1.

The function of the conventional composite LC element will be described. In FIGS. 1 and 2, a circuit formed between the terminals 3a, 3b functions as an inductance coil and a circuit between the terminals 4a, 5b functions as a capacitance. FIG. 3 shows the equivalent circuit of the element wherein inductance is obtainable between the terminals 3a, 3b and capacitance is obtainable between the terminals 4a, 5b.

As described above, the conventional composite LC element comprises a coil which is formed by winding a single electrode sheet and two insulating films or papers around a core, and a capacitor which is formed by winding two electrode sheets and two insulating films or papers as dielectric substances on the outer circumference of the coil in a concentric manner. Accordingly, the conventional composite LC element is constituted by a coil and a capacitor having an independent distributed constant, and they are simply combined in a concentric manner.

SUMMARY OF THE INVENTION

It is an object of the present invention to eliminate the above-mentioned problem and to provide a composite LC element which is capable of forming a distributed constant type filter and has both function of common mode choke and normal mode choke.

In accordance with the present invention, there is provided a composite LC element including integrally a coil and a capacitor which comprises a layered film structure wherein two insulating films and two electrode sheets with terminals at their both ends are alternately laminated, said layered film structure being wound in a spiral form from its one end.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 10A and 10B are respectively diagrams showing the equivalent circuits of the composite LC element of the second embodiment;

FIG. 11 is a diagram showing the layered film structure of a third embodiment of the present invention;

FIG. 12 is a diagram showing the equivalent circuit of a composite LC element formed of the layered film structure of the third embodiment;

FIG. 33 is a perspective view of the composite LC element of a ninth embodiment of the present invention;

FIG. 34 is a diagram showing a construction of the layered film structure for the composite LC element as shown in FIG. 33;

FIG. 35 is a perspective view of an embodiment of a ribbon line used for the embodiment as shown in FIGS. 33 and 34;

DETAILED DESCRIPTION OF THE PREFERRED EMBODIMENTS

Figure 1:
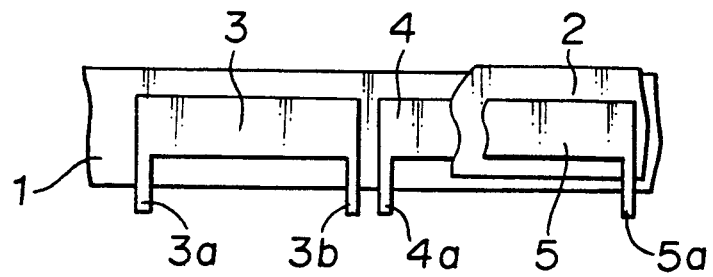
FIG. 1 is a diagram showing a layered film structure of a conventional composite LC element.

FIGS. 4 through 8 shows a first embodiment of the present invention wherein the same reference numerals designate the same or corresponding parts throughout the Figures.

Figure 4:
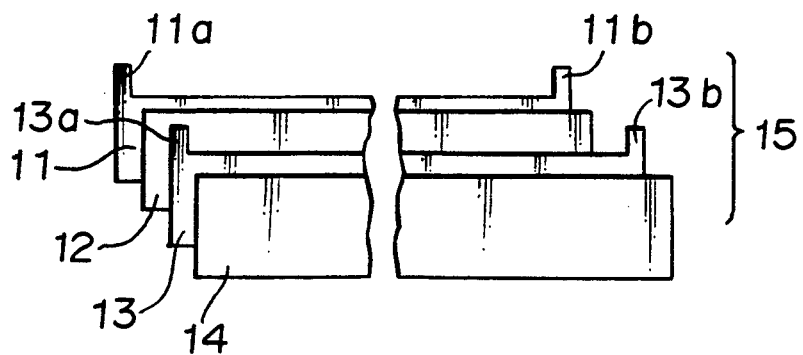
FIG. 4 is a diagram of the layered film structure according to a first embodiment of the present invention.

In FIG. 4, reference numerals 11 and 13 designate strip-like electrode sheets made of a material such as copper or aluminum, numerals 11a and 11b designate terminals provided at both ends of the electrode sheet 11 and numerals 13a and 13b designate terminals provided at both ends of the electrode sheet 13. These terminals 11a, 11b, 13a, 13b may be extensions formed integrally with the electrode sheets 11, 13, or may be lead wires, as separate pieces, which are attached to the electrode sheets 11, 13 by, for instance, welding. Numerals 12 and 14 respectively designate strip-like insulating films having a shape slightly wider and longer than the electrode sheets 11, 13, which are made of a material such as polyester, paper or the like having dielectric property.

Figure 5:
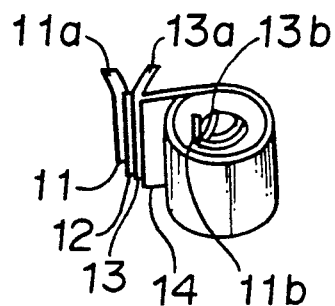
FIG. 5 is a diagram illustrating an assembly of the layered film structure as in FIG. 4.

First of all, a layered film structure 15 is formed by alternately laminating the electrode sheet 11, the insulating film 12, the electrode sheet 13 and the insulating film 14 as shown in FIG. 4, and the layered film structure 15 having four layers is wound spirally from its end into an integral coil form (FIG. 5).

The insulating films 12, 14 may not be of the same material, but an insulating film of a different material and thickness may be used. In the embodiment as shown in FIG. 4, an insulating film having a high dielectric property is used for the insulating film 12 interposed between the electrode sheets 11, 13, and an insulating film having a low dielectric property is used for the insulating film 14.

Figure 6:
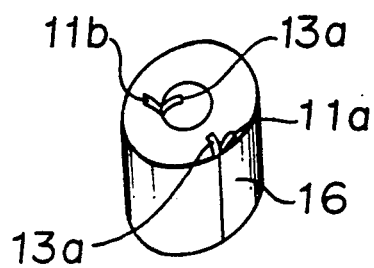
FIG. 6 is a perspective view of a composite LC element formed by winding the layered film structure as shown in FIG. 4.
Figure 7:
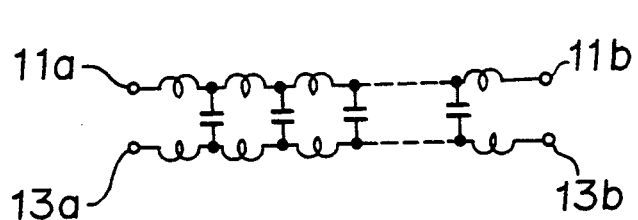
FIGS. 7 and 8 are respectively diagrams showing the equivalent circuits of the composite LC element of the first embodiment.

A cylindrical coil 16 as shown in FIG. 6 has the equivalent circuit as shown in FIG. 7 wherein the circuits between the terminals 11a, 11b and between the terminals 13a, 13b function as coils and the interlayer circuit between the circuits provides a capacitance in a distributed form.

Figure 8:
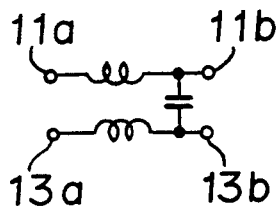

When the equivalent circuit as in FIG. 7 is modified to be a concentrated constant form, it functions as a common mode choke having L and C, and constitutes a distributed constant type common mode choke or a line filter as shown in FIG. 8.

A second embodiment of the layered film structure of the present invention will be described with reference to FIGS. 9 and 10.

Figure 9:
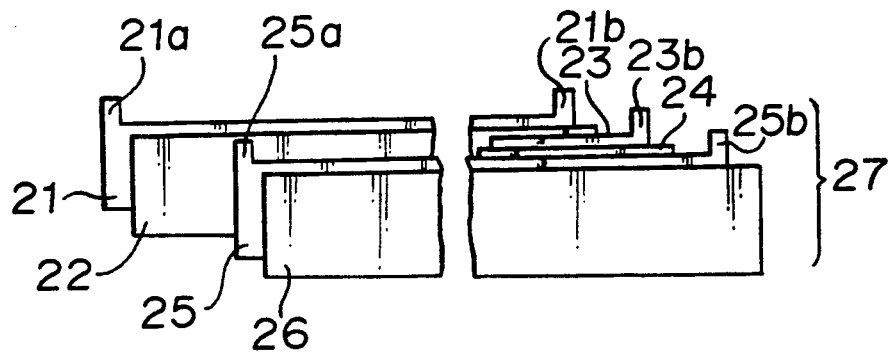
FIG. 9 is a diagram showing the layered film structure according to a second embodiment of the present invention.

In FIG. 9, numerals 21 and 25 designate strip-like electrode sheets made of a material such as copper, aluminum or the like, a numeral 23 designates a strip-like intermediate electrode sheet having a length shorter than those of the electrode sheets 21, 25, numerals 21a and 21b designate terminals provided at both sides of the electrode sheet 21, numerals 25a and 25b designate terminals provided at both sides of the electrode sheet 25, and a numeral 23b designates a terminal provided at one side of the intermediate electrode sheet 23. These terminals 21a, 21b, 23b, 25a, 25b may be extensions formed integrally with the electrode sheets 21, 25 and the intermediate electrode sheet 23, or may be lead wires independent of the electrode sheets 21, 25 and the intermediate electrode sheet 23, which are attached to them by welding. Numerals 22, 24 and 26 designate strip-like insulating films made of a material such as polyester, paper or the like, which have a shape slightly wider and longer than the electrode sheets 21, 25 and the intermediate electrode sheet 26 respectively.

In the preparation of a cylindrical composite LC element, a layered film structure 27 is formed by alternately laminating the electrode sheets 21, 25, the intermediate sheet 26 and the insulating films 22, 24, 26 as shown in FIG. 9. The three-layered film structure comprising 6 layers of the electrode sheets and insulating films is wound in a spiral form from the one end wherein the center has a bore, whereby the composite LC element in a coil form is obtained in the same manner as the first embodiment (FIG. 5).

FIGS. 10A and 10B show the equivalent circuits of the cylindrical laminated coil corresponding to the cylindrical coil 16 as shown in FIG. 6.

In FIG. 10A, numerals 1La, 1Lb, 5La, 5Lb indicate distributed inductances which are effected by the electrode sheets 21, 25, numerals 28Ca, 28Cb designate interlayer capacitances by the electrode sheets 21, 25, numerals 29Ca, 29Cb designate interlayer capacitances by the electrode sheet 21 and the intermediate electrode sheet 23, and numerals 30Ca, 30Cb designate interlayer capacitances by the electrode sheet 25 and the interlayer electrode sheet 23.

When the circuit as shown in FIG. 10A is viewed from the side of the four terminals 21a, 25a, 21b and 25b, it is equivalent to a concentrated constant noise filter as shown in FIG. 10B. In FIG. 10A, the capacitances 28Ca, 28Cb are generally referred to as X capacitors. In the capacitance C in FIG. 10B and the capacitances 29Ca, 30Ca in FIG. 10A are generally referred to as Y capacitors. The inductances 1La, 1Lb 5La, 5Lb in FIG. 10A function as common mode choke coils La, Lb in FIG. 10B. The above-mentioned embodiment of the present invention provides improved frequency characteristics since distributed constant effect can be provided by the above-mentioned factors.

A third embodiment of the present invention will be described with reference to FIGS. 11 and 12. The third embodiment further develops the second embodiment. In the third embodiment, the number of lamination is increased to be adapted to three-phase a.c. application. In FIG. 11, numerals 31, 35 and 39 designate strip-like electrode sheets made of a material such as copper, aluminum or the like, numerals 33, 37 and 41 designate strip-like intermediate electrode sheets each having a length shorter than the electrode sheets, numerals 31a and 31b designate terminals provided at both sides of the electrode sheet 31, numerals 35a and 35b designate terminals provided at both sides of the electrode sheet 35, numerals 39a and 39b designate terminals provided at both sides of the electrode sheet 39, a numeral 33b designates a terminal provided at one side of the intermediate electrode sheet 33, a numeral 37b designates a terminal provided at one side of the intermediate electrode sheet 37 and a numeral 41b designates a terminal provided at one side of the intermediate electrode sheet 41. These terminals may be extensions integrally formed with the electrode sheets, or may be lead wires separate from the electrode sheets, which are attached to them by welding, in the same manner as the first and second embodiments. Numerals 32, 34, 36, 38, 40 and 42 designate strip-like insulating films made of a material such as polyester, paper or the like and have a shape slightly wider and longer than the electrode sheets 31, 35, 39 and the intermediate electrode sheets 33, 37, 41 respectively.

In the preparation of a cylindrical laminated coil as shown in FIGS. 5 and 6 (which corresponds to the coil indicated by the numeral 16), a layered film structure 43 is formed by alternately laminating the electrode sheets 31, 35, 39, the intermediate sheets 33, 37, 41 and the insulating films 34, 36, 38, 40, 42 as shown in FIG. 11 to form a film assembly consisting of 12 layers. Thus formed layered film structure 43 is wound in a spiral form from its one end in which a bore is formed in the center. Thus, a cylindrical laminated coil is obtainable.

FIG. 12 shows the equivalent circuit of the laminated coil having the layered film structure as shown in FIG. 11.

As described above, it is possible to prepare a distributed constant type coil having a large number of laminated layers. Further, the intermediate electrode sheets used in the second and third embodiments can be used for common mode cancellation. In addition, the laminated coil can be modified to be of an inductionless structure by short-circuiting the terminals 33b, 37b, 41b of the intermediate electrode sheets 33, 37, 41 with a short-circuit line 44 as shown by a dotted line in FIG. 12.

Figure 13:
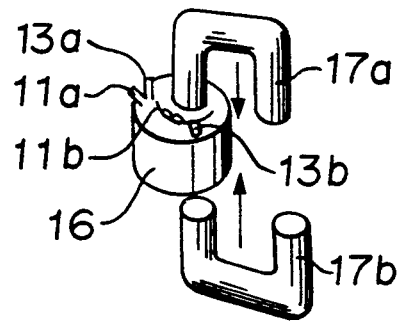
FIGS. 13, 14 and 15 are respectively perspective views showing other embodiments of the composite LC element of the present invention.
Figure 14:
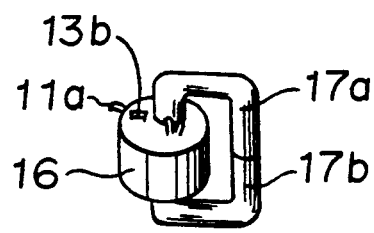

In the embodiments described before, the cylindrically laminated coils with a bore are prepared. However, it is possible to prepare a composite LC element with magnetic cores 17a, 17b made of ferrite or the like as shown in FIG. 14, the composite LC element being prepared by inserting U-shaped magnetic cores 17a, 17b into the center of the cylindrical coil as shown in FIG. 13. It is also possible to magnetically couple a plurality of coils by inserting U-shaped magnetic cores 17a, 17b into cylindrically laminated coils 16, 16' as shown in FIG. 15.

Figure 15:
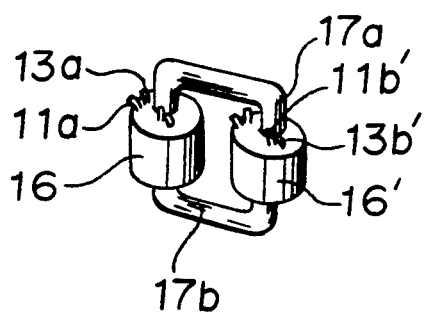
Figure 16:
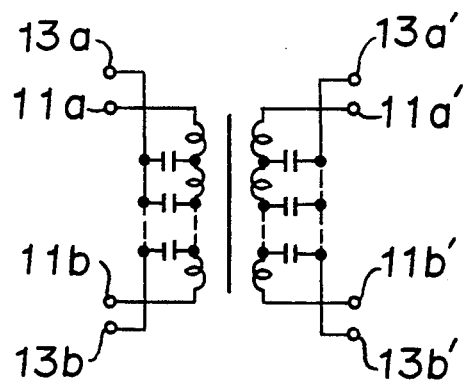
FIG. 16 is a diagram showing the equivalent circuit of a composite LC element as shown in FIG. 15.

FIG. 16 shows the equivalent circuit of the magnetically coupled coils shown in FIG. 15, which can be used as a distributed constant type common mode choke or a transformer. The shape in cross-section of coils may be square or rectangular other than a round shape as described above. In FIGS. 15 and 16, numerals 11a', 11b', 13a' and 13b' designate terminals provided at the laminated coil 16'.

Figure 17:
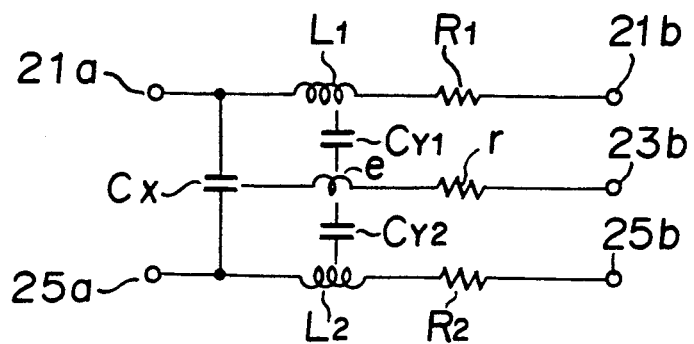
FIG. 17 is a diagram showing the equivalent circuit of an embodiment which is modified from the embodiment shown in FIG. 9.

A fourth embodiment of the present invention will be described. The fourth embodiment is to eliminate a problem that increase in the equivalent resistance r of the intermediate electrode sheet (for earthing) 23b and the inductance (FIG. 17) may affect the total performance of the filter.

In accordance with the fourth embodiment, the resistance of the electrode sheet for earthing is reduced by providing a composite LC element including a coil and a capacitor integrally which comprises a layered film structure formed by alternately laminating a plurality of insulating films and a plurality of electrode sheets each having terminals at its both ends and an intermediate portion, the layered film structure being wound in a spiral form from its one end, wherein the electrode sheets are electrically connected by connecting anyone of the terminals.

The concrete example of the composite LC element according to the fourth embodiment will be described with reference to FIGS. 18 through 20.

Figure 18:
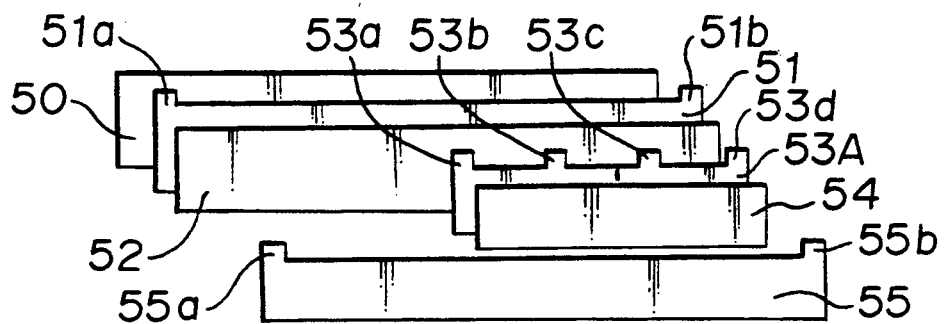
FIG. 18 is a diagram of the layered film structure of a fourth embodiment of the present invention.

In FIG. 18, numerals 50, 52 and 54 designate insulating films, numerals 51, 53A and 55 designate metallic electrode sheets, numerals 51a, 51b, 55a and 55b designate terminals of the electrode sheets which constitute main electrodes, and numerals 53a through 53d designate terminals provided at both ends and a desired intermediate portion of the electrode sheet 53a for earthing.

Figure 19:
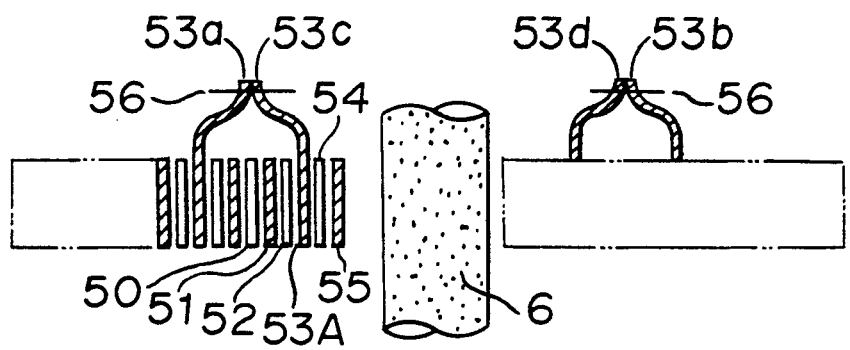
FIG. 19 is a diagram showing the construction of a composite LC element formed of the layered film structure as shown in FIG. 18.
Figure 20:
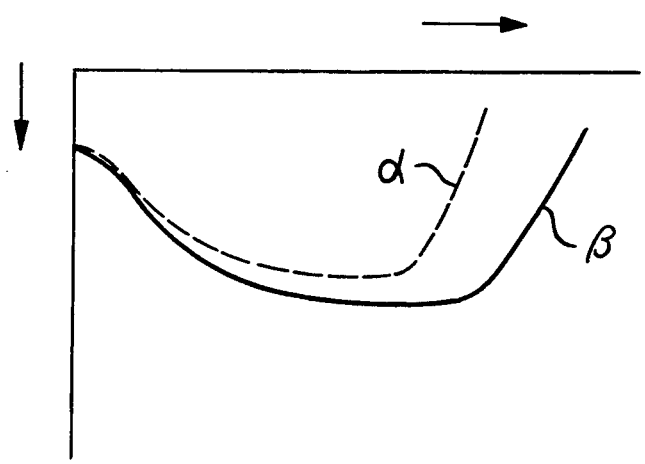
FIG. 20 is a diagram showing the attenuation characteristic of the composite LC element of the fourth embodiment before the improvement (a) and after the improvement ($\beta$)

In the preparation of a composite LC element as shown in FIG. 19, a layered film structure is formed by alternately laminating the insulating films 50, 52, 54 and the electrode sheets 51, 53A, 55 as shown in FIG. 18. Then, the laminated film structure is wound in a spiral form from its one end while a magnetic substance 6 is used as a core at the center, whereby a laminated coil is obtainable. Then, the terminal 53a and the terminal 53d are respectively connected to the terminal 53c and the terminal 53b by welding or brazing to thereby short-circuit them. A numeral 56 designates connecting portions. Thus, the equivalent resistance component r and the inductance l of the electrode sheet for earthing 53A can be reduced, and the attenuation characteristics can be improved in the frequency band region as shown in curved lines (which indicate a state before improvement a and a state after improvement β) as shown in FIG. 20.

Figure 21:
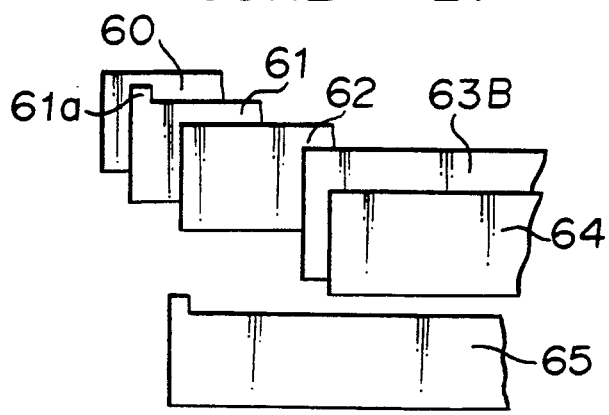
FIG. 21 is a diagram of the layered film structure of a fifth embodiment of the present invention.
Figure 22:
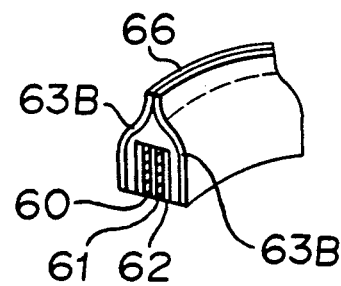
FIG. 22 is a perspective view partly broken of a composite LC element formed of the layered film structure shown in FIG. 21.

A fifth embodiment of the present invention will be described with reference to FIGS. 21 and 22. The composite LC element of the fifth embodiment is prepared in such a manner that electrode sheets 61, 65 which are used as main electrodes, an intermediate electrode 63B having a width broader than the main electrode and insulating films 60, 62, 64 are laminated in the order as shown in FIG. 21; a layered film structure obtained by laminating the sheet materials is wound from its one end to form a coil; and portions of the electrode sheets 63B having a broad width, which extend from a side of the coil are connected to each other by welding or brazing so as to interpose the insulating films 60, 62, 64 and the electrode sheets 61, 65 between the electrode sheets 63B. The composite LC element of the fifth embodiment provides the same effect as the fourth embodiment.

Figure 23:
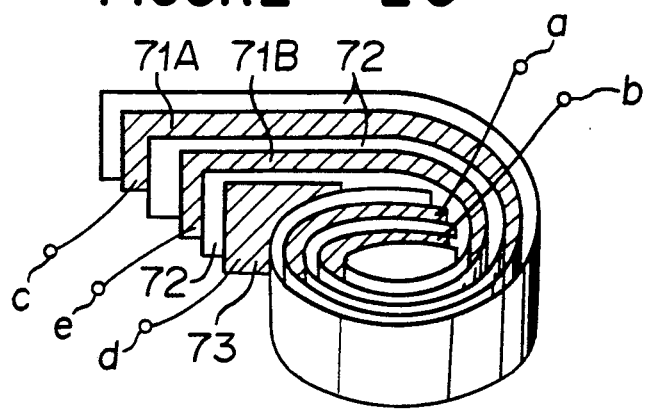
FIG. 23 is a diagram showing a concept of the composite LC element of a sixth embodiment.

FIG. 23 is a diagram of a composite LC element from which the idea of sixth embodiment of the present invention is derived. In FIG. 23, reference numerals 71A and 71B designate main electrode sheets, a numeral 72 designate an insulating film and a numeral 73 designate an electrode sheet for earthing. After these sheet materials have been laminated, the assembly is wound from its one end in a spiral form to thereby form a cylindrical composite LC element.

Figure 24:
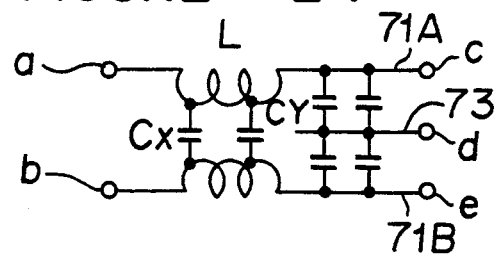
FIG. 24 is a diagram of the equivalent circuit of the composite LC element shown in FIG. 23.

FIG. 24 shows the equivalent circuit of the composite LC element. In the composite LC element as shown in FIG. 24, parastic capacitances CX and CY are produced at the interlayered insulating film 72, and a parastic inductance L is produced in the wound electrode sheets 71A, 71B, 73. In FIG. 24, reference characters a-e designate terminals formed in the electrode sheet or attached to them by welding.

Figure 25:
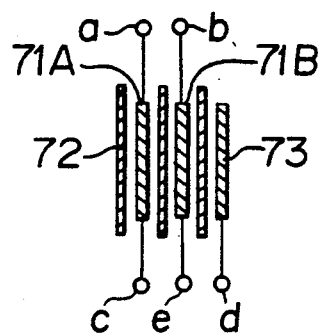
FIG. 25 is a diagram showing a cross-sectional surface area of the composite LC element shown in FIG. 23 and showing a method of connecting the terminal.

In the diagram as shown in FIG. 25, the terminals a and c are connected at both ends of the electrode sheet 71A; the terminals b and e are connected to both ends of the electrode sheet 71B and the terminal d is connected to an end of the electrode sheet 73.

In the conventional composite LC element, the length of the electrode sheets was simply increased or decreased in order to increase or decrease the parastic capacitance and the parastic inductance depending on requirements of the performance of a filter in the composite LC element. Further, the width or the thickness of the electrode sheets was increased or decreased in order to increase or decrease the withstand current value. In either case, however, the performance is directly influenced by the volume of the wound electrode sheets, and the volume becomes bulky as the capacity is increased. Therefore, the quality of products was poor.

The sixth embodiment of the present invention is to eliminate the above-mentioned problem. In accordance with the sixth embodiment, there is provided a composite LC element which comprises a layered film structure formed by alternately laminating a plurality of electrode sheets each having a terminal at at least one end and a plurality of insulating films, the layered film structure being wound in a spiral form from its one end so that a spiral coil is formed by each of the electrode sheets and a capacitor is formed by each adjacent pairs of the electrode sheets between which the insulating film is interposed, wherein selected paired electrodes interposing the insulating film therebetween is electrically connected to the other paired electrodes so as to divide the capacitance.

The sixth embodiment of the present invention will be described with reference to FIGS. 26 and 27 wherein the same reference numerals as in FIGS. 23 through 25 designate the same or corresponding parts.

Figure 26:
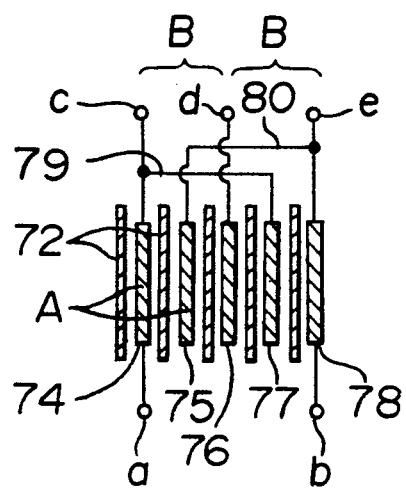
FIG. 26 is a diagram showing a cross-sectional surface of the composite LC element of the sixth embodiment of the present invention and showing a method of connecting the terminals.
Figure 27:
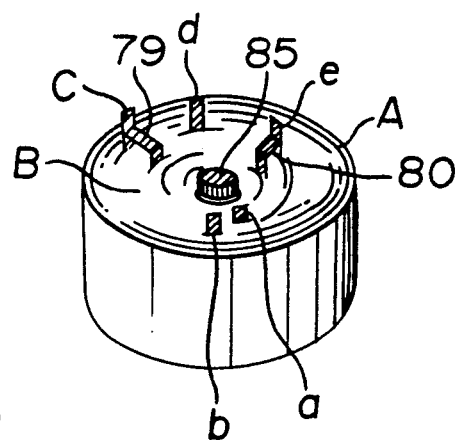
FIG. 27 is a perspective view of the composite LC element shown in FIG. 26 wherein the layered film structure is wound around a magnetic substance.

In FIGS. 26 and 27, reference numerals 74 through 78 designate electrode sheets interposing insulating films 72 therebetween. The electrode sheets 74 and 77 are connected to each other at a terminal c by a connecting line 79 and they form a main electrode sheet at one side. The electrode sheets 75 and 78 are connected to each other at a terminal e by a connecting line 80 and they form a main electrode sheet at the other side. The electrode sheet 76 is connected with a terminal d to provide an earth electrode. By winding the layered film structure comprising the electrode sheets 74 through 78 from its an end in a spiral form, there is obtainable a composite LC element including coils A formed by spirally wound electrode sheets 74 through 78 and capacitors B formed by the electrode sheets 74 through 78 interposing the insulating films 72 therebetween, in one piece.

FIG. 27 is a perspective view of the composite LC element wherein a magnetic substance 85 is placed as a core at the center of the element.

The connecting lines 79, 80 may be connected at the time of forming the layered film structure, or may be connected after the formation of the composite LC coil element. In FIGS. 26 and 27, terminals a and c are provided at the electrode sheet 74 at positions apart from each other, and terminals b and e are provided at the electrode sheet 78 at positions apart from each other. Inductances are produced between the terminal a and the terminal c and between terminal b and the terminal e.

As shown in FIG. 26, the electrode sheet 74 is connected to the electrode sheet 77 through the connecting line 79 at a portion outside the laminated structure, and the electrode sheet 75 is connected to the electrode sheet 78 through the connecting line 80 outside the laminated structure. Thus, the parastic capacitance of the double-layered structure is about twice as large as a single-layered electrode, whereby the length of the electrode sheets can be reduced.

Although the inductance of the double layered structure changes, it can be corrected by using the magnetic substance 85. Further, the surface area of the electrode sheets in the double-layered structure is twice as that of the single-layered structure. Accordingly the surface of heat radiation can be increased and the durability to a current is increased. When a current is to be increased twice, it is sufficient to change the construction of electrode sheets from a single-layered structure to a double-layered structure.

A seventh embodiment of the composite LC element of the present invention will be described with reference to FIG. 28 wherein the same reference numerals as in FIGS. 23 through 27 designate the same or corresponding parts.

Figure 28:
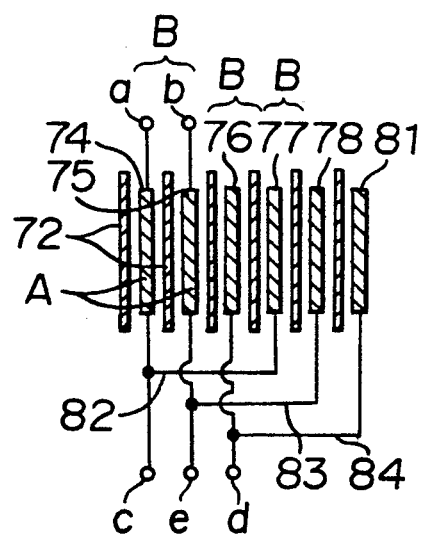
FIG. 28 is a diagram showing a cross-sectional surface of the composite LC element of another embodiment of the present invention and showing a method of connecting the terminals.

In FIG. 28, reference numerals 74 through 78 designate electrode sheets laminated interposing insulating films 72 therebetween. In the sixth embodiment, two main electrode (74, 77), (75, 78) are formed to be double. In this embodiment, however, the earth electrode is also formed to be double, i.e. earth electrode sheets 76, 81, whereby further improvement in characteristics is obtainable.

The electrode sheet 74 is connected to the electrode sheet 77 at a terminal c by a connecting line 82 so that a main electrode sheet is formed at one side. The electrode sheet 75 is connected to the electrode sheet 78 at a terminal e by a connecting line 83 so that a main electrode is formed at the other side. The electrode sheet 76 is connected to the electrode sheet 81 at a terminal d by a connecting line 84 so that an earth electrode sheet is formed. A composite LC element is formed by the above-mentioned layered film structure in the same manner as the embodiments described above.

In the composite LC element of the sixth and seventh embodiments, it is possible to electrically connect in parallel or in series electrode sheets as desired.

Figure 2:
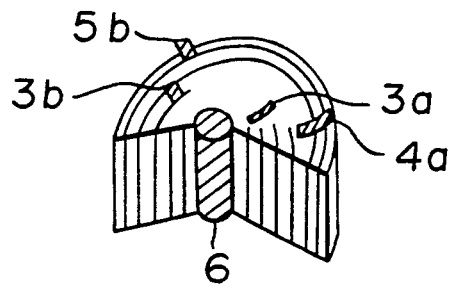
FIG. 2 is a perspective view partly broken of the conventional composite LC element.
Figure 3:
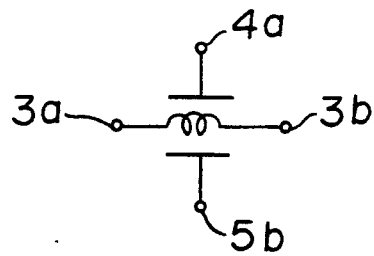
FIG. 3 is a diagram of the equivalent circuit of the composite LC element as shown in FIG. 2.
Figure 29:
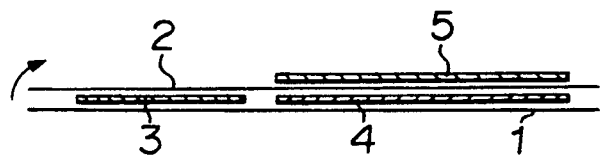
FIG. 29 is a longitudinal cross-sectional view of the layered film structure of a conventional composite LC element.

Before describing the composite LC element according to an eighth embodiment of the present invention, a problem resulted in a conventional composite LC element will be described. FIG. 29 is a longitudinal cross-sectional view of a conventional composite LC element having a layered film structure as illustrated in FIGS. 1 through 3, which is shown in Japanese Unexamined Patent Publication 139619/1984, and FIG. 30 is an enlarged cross-sectional view of the broken part in FIG. 2.

Figure 30:
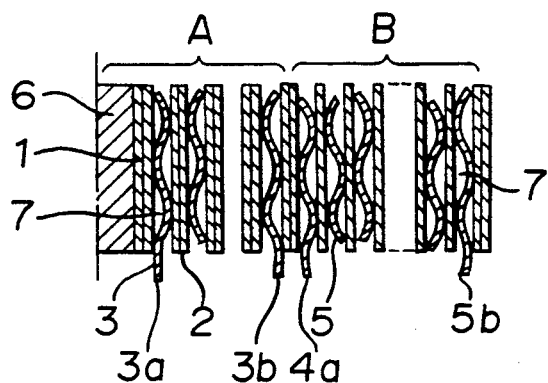
FIG. 30 is an enlarged cross-sectional view of the conventional composite LC element as shown in FIG. 2.

As shown in FIG. 30 which shows a cross-sectional area of the conventional composite LC element which is formed by winding the layered film structure, spaces are produced between an insulating film 1 or 2 and an electrode sheet 4 or 5 which are adjacent to each other because these materials are not always flat, whereby there may cause a corona discharge due to an air gap 7 formed between layers in the composite LC element.

The eighth embodiment of the present invention is to eliminate the above-mentioned problem. According to the eighth embodiment of the present invention, there is provided a composite LC element which comprises a layered film structure formed by alternately laminating a plurality of electrode sheets each having a terminal at least one end and a plurality of insulating films, the layered film structure being wound in a spiral form from its one end so that a spiral coil is formed by each of the electrode sheets wound and a capacitor is formed by each adjacent pairs of the electrode sheets between which the insulating film is interposed, wherein metallic films are formed on both surfaces of the interposed insulating films so that the metallic films is in contact with the electrode sheets which are adjacent the insulating films.

In the eighth embodiment, since multi-contact conditions can be provided between metallic films attached to both surfaces of the insulating films and the electrode sheets laminated to the insulating films, there is no danger of occurrence of any potential differences between the electrode sheets and the insulating films even though an air gap is produced, so that occurrence of a corona discharge is suppressed.

Figure 31:
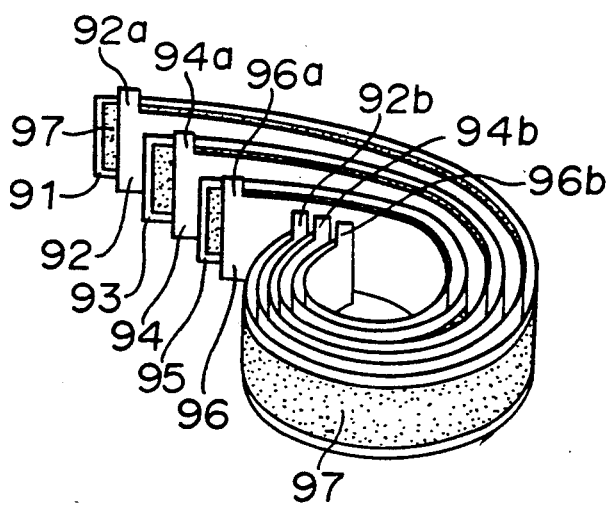
FIG. 31 is a diagram showing the layered film structure of an eighth embodiment of the present invention.

The eighth embodiment of the present invention will be described with reference to FIGS. 31 and 32 wherein reference numerals 91, 93 and 95 designate insulating films, numerals 92, 94 and 96 designate electrode sheets, numerals 92a, 92b, 94a, 94b, 96a and 96b are terminals provided at the electrode sheets, and numerals 97 designate metallic films attached to both surfaces of the insulating films 91, 93, 95 by a vapor deposition method to have a thickness in a range of 2 $\mu$m–10 $\mu$m.

A composite LC element including a coil and a capacitor integrally is formed as follows. A laminated film structure is formed by alternately laminating the insulating films 91, 93, 95 each having the both surface attached with the metallic films 97 and the electrode sheets 92, 94, 96. The laminated film structure is wound in a spiral form from its one end to thereby form a coiled laminated body wherein coils A formed by winding the electrode sheets 92, 94, 96 as conductors and capacitors B formed by the electrode sheets 92, 94, 96 interposing the insulating films 93, 95 with metallic films between two electrode sheets are included.

Figure 32:
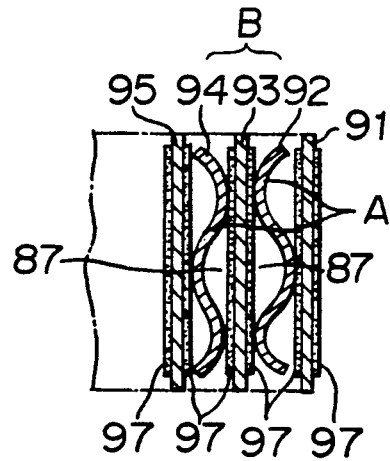
FIG. 32 is an enlarged cross-sectional view of a part of a composite LC element formed of the layered film structure shown in FIG. 31.

FIG. 32 is a cross-sectional view of a part of the composite LC element. A sufficient contact can be obtained between the metallic films 97 and the insulating films 91, 93, 95 even though the flatness of the electrode sheets 92, 94, 96 is poor to thereby produce air gaps 87. Accordingly, there is no danger of producing potential differences between the electrode sheets 92, 94, 96 and the insulating films 91, 93, 95, and the occurrence of a corona discharge at the air gaps 87 can be suppressed.

The composite LC element of the present invention is impregnated with resin. Accordingly, the occurrence of a corona discharge can be prevented in the same manner as above even though a gap of air (void) takes place.

In the conventional composite LC element as shown in FIGS. 1 through 3, it was necessary that the opposing surface areas of the electrode sheets 3, 4, 5 were enlarged or the insulating films having a high dielectric constant were used in order to obtain a large capacitance since the composite LC element was formed by winding the electrode sheets 3, 4, 5 and the insulating films 1, 2 in a cylindrical coil form. However, in order to increase the opposing surface areas of the electrode sheets 3, 4, 5, it was necessary to elongate the electrode sheets whereby there was a problem that the volume of the cylindrical coil was large, hence, the size of the composite LC element was large. On the other hand, when the insulating films having a high dielectric constant were used, the cost of the composite LC element became high because such films are expensive.

In accordance with a ninth embodiment of the present invention, there is provided a composite LC element comprising a plurality of conductive layers which are wound in a cylindrical form around a magnetic core by interposing insulating films to thereby form coils and capacitors, wherein the conductive layers are formed by ribbon lines or metallic foils having a large mat surface, whereby the opposing surface areas of the conducting layers, i.e. the capacitances between the conductors are made greater than those obtained by using the conventional electrode sheets, while the conductors are made small to thereby reduce the size of the composite LC element without increasing manufacturing cost.

The ninth embodiment of the present invention will be described with reference to FIGS. 33 through 35.

The composite LC element of this embodiment comprises a magnetic core 102 and a cylindrical coil 101 fitted to the magnetic core 102 as shown in FIG. 33.

The cylindrical coil 101 is prepared as follows. A short ribbon line 103 having a terminal 103a at its an end, a long ribbon line 104 with terminals 104a, 104b at both ends and a long ribbon line 105 with terminals 105a, 105b at both ends are laminated in the sequential order of ribbon line 104, 103 and 105 interposing insulating films 106 made of polyester between adjacent ribbon lines to thereby form a laminated body, and the laminated body is wound in a spiral form from its one end.

Each of the ribbon lines 103, 104, 105 is prepared by arranging a plurality of lines 107 in a parallel relation and then, by covering and connecting them with an insulator 108. The ribbon lines 103, 104, 105 have the same shape and dimensions as the insulating films 106 which oppose the ribbon lines.

The conductors in the ninth embodiment are constituted by the wires 107 of the ribbon lines 103, 104, 105, and the insulators 108 of the ribbon lines 103, 104, 105. The ribbon line 103 constitutes an earth layer.

The composite LC element of the ninth embodiment has the same equivalent circuit as that shown in FIG. 10B, namely, it includes coils and capacitors equivalently.

The operation of the ninth embodiment will be described.

Since each of the ribbon lines 103, 104, 105 is constituted by a group of the wires 107 the total surface area of the wires 107 per unit surface area of each of the ribbon lines 103, 104, 105 is fairly large in comparison with the conventional electrode sheet. Accordingly, the capacitance between adjacent groups of wires 107 of the ribbon lines 103, 104, 105 are large. Therefore, in comparing the use of the ribbon lines 103, 104, 105 with the use of electrode sheets 3, 4, 5 as conductors in order to obtain the same capacitance, the length of the ribbon lines 103, 104, 105 can be shorter than that of the electrode sheets. Accordingly, in accordance with the ninth embodiment of the present invention, the size of the composite LC element can be reduced with little increase of manufacturing cost.

Figure 36:
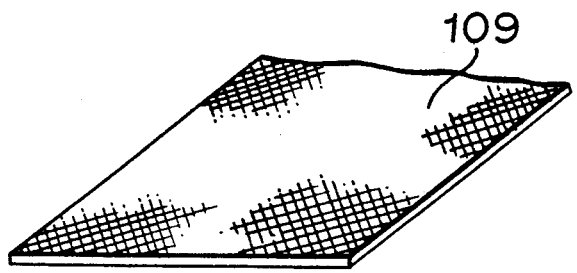
FIG. 36 is a perspective view of a metallic sheet having a mat surface used for the embodiment as shown in FIGS. 33 and 34.

For the conductor for earthing, a conventional electrode sheet may be used. Further, for the conductors, metallic sheets having mat surfaces 109 may be used as shown in FIG. 36 in order to obtain the same function as in the above-mentioned embodiment.

In the ninth embodiment, the insulating films 106 may be omitted because the insulators 108 which cover the ribbon lines 103, 104, 105 function as an insulating material.

Before the construction and the function of a tenth embodiment of the present invention is described, a problem existing in a conventional noise filter will be discussed. A conventional noise filter includes the composite LC element as shown in FIGS. 1 through 3, which comprises a laminated coil formed by winding on a core a single electrode sheet and two insulating films, and a capacitor formed by winding on the outer circumference of the laminated coil two electrode sheets and two insulating films or papers as dielectric substances. Accordingly, there are independently distributed constant coil and a distributed constant capacitor, which are simply combined in a concentric fashion. Further, in the conventional composite LC element, terminals are not fixed, whereby it is difficult to obtain correct inductance values and/or capacitance values when it is used for a noise filter.

The tenth embodiment of the present invention is to eliminate the above-mentioned problem, and to provide a noise filter including a coil and a capacitor which comprises a composite LC element formed by winding a layered film structure in a spiral form from its one end, the layered film structure being formed by laminating alternately a plurality of electrode sheets each having terminals at both ends and a plurality of insulating films, a magnetic core placed at the central portion of the spirally wound composite LC element and a holder which holds the terminals of the composite LC element at predetermined fixed portions.

The composite LC element in the noise filter has a simple structure, and functions as a distributed constant type composite LC element. Further, it is stable in obtaining a correct capacitance and inductance because the terminals are fixed by means of the holders.

The tenth embodiment of the present invention will be described with reference to FIGS. 37 and 38.

Figure 37:
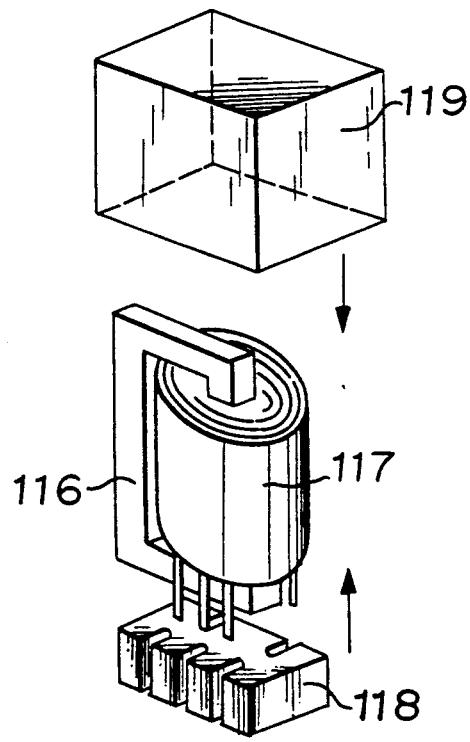
FIG. 37 is a perspective view in a disassembled state of an embodiment of the noise filter of the present invention.
Figure 38:
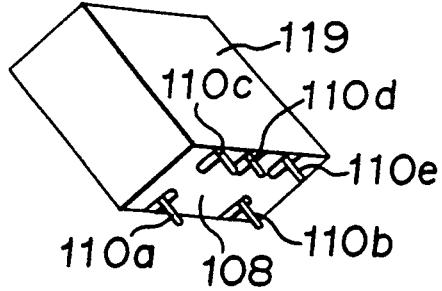
FIG. 38 is a perspective view of the noise filter as shown in FIG. 37, which is viewed from the direction of the terminals.

In FIGS. 37 and 38, a reference numeral 117 designates a composite LC element having same construction as described before. Specifically, the composite LC element is prepared as follows. A layered film structure is formed by alternately laminating a plurality of electrode sheets having terminals at both ends, at least one intermediate electrode sheet having a terminal at its one side, and a plurality of insulating films, and the layered film structure is wound in a spiral form from its an end so as to be integrally formed and to have a common mode choke function.

A numeral 118 designates a base as a holder having an insulating property which fixes terminals, a numeral 119 designates a casing which contains therein the composite LC element 117 and numerals 110a through 110e designate terminals attached to the electrode sheets of the composite LC element 117.

A magnetic core 116 is inserted at the central portion of the composite LC element 117 to form a magnetic circuit. The base 118 is attached to the composite LC element 117 at the side of the terminals so that a part of the terminals 110a–110e are exposed. The case 119 is put on the base 118 so as to enclose the composite LC element 117. Thus, a noise filter is completed.

The noise filter may be packaged in a base plate or may be attached to it as a separate component.

Figure 39:
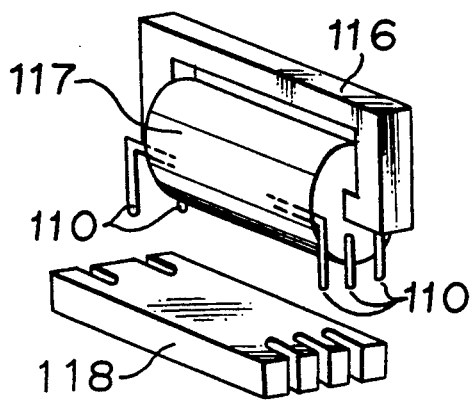
FIG. 39 is a perspective view in a disassembled state of another embodiment of the noise filter according to the present invention.

An eleventh embodiment of the present invention will be described with reference to FIG. 39. The noise filter as in FIG. 39 is a modified embodiment of the noise filter of the tenth embodiment.

The noise filter of the eleventh embodiment is of a lateral type which is different from the vertical type noise filter of the tenth embodiment. In the eleventh embodiment, a casing which is provided in the tenth embodiment may be eliminated.

Obviously, numerous modifications and variations of the present invention are possible in light of the above teachings. It is therefore to be understood that within the scope of the appended claims, the invention may be practiced otherwise than as specifically described herein.

What is claimed is:

1. A composite LC element including integrally a coil and a capacitor which comprises a layered film structure which consists of a plurality of laminated layers, each comprising at least two electrode sheets having similar lengths and terminals at both ends, an intermediate electrode sheet with a terminal at its one side and having a length shorter than that of said electrode sheets and insulating films interposed between said electrode sheets and said intermediate electrode sheet wherein said layered film structure is wound in a spiral form from its one end.

2. A composite LC element including integrally a coil and a capacitor which comprises a layered film structure formed by alternately laminating a plurality of insulating films and a plurality of electrode sheets of similar length each having terminals at both its ends and an intermediate portion, said layered film structure being wound in a spiral form from its one end, wherein said electrode sheets are electrically connected by connecting any one of said terminals.

3. A composite LC element which comprises a layered film structure formed by alternately laminating a plurality of electrode sheets each having a terminal at least one end and a plurality of insulating films, said layered film structure being wound in a spiral form around a magnetic core from its one end so that a spiral coil is formed by each of said electrode sheets wound and a capacitor is formed by each adjacent pairs of said electrode sheets between which the insulating film is interposed, wherein selected paired electrodes interposing the insulating film therebetween is electrically connected to the other paired electrodes to form a plural-layered structure to increase the parasitic capacitance and decrease the inductance, said decrease in inductance being corrected by said magnetic core.

4. A composite LC element which comprises a layered film structure formed by alternately laminating a plurality of electrode sheets each having a terminal at least one end and a plurality of insulating films, said layered film structure being wound in a spiral form from its one end so that a spiral coil is formed by each of said electrode sheets wound and a capacitor is formed by each adjacent pairs of said electrode sheets between which the insulating film is interposed, wherein metallic films are formed on both surfaces of said interposed insulating films so that the metallic films are in contact with the electrode sheets which are adjacent said insulating films.

5. A composite LC element comprising a plurality of conductive layers which are wound around a magnetic core by interposing insulating films in a cylindrical form to thereby form a coil and a capacitor, wherein each of said conductive layers is formed by a ribbon line or a metallic foil having a large mat surface area.

* * * * *